United States Patent
Keil et al.

(10) Patent No.: US 10,224,182 B2
(45) Date of Patent: Mar. 5, 2019

(54) MECHANICAL SUPPRESSION OF PARASITIC PLASMA IN SUBSTRATE PROCESSING CHAMBER

(75) Inventors: Douglas Keil, West Linn, OR (US); Edward Augustyniak, Tualatin, OR (US); Karl Leeser, Lake Oswego, OR (US); Mohamed Sabri, Beaverton, OR (US)

(73) Assignee: NOVELLUS SYSTEMS, INC., Fremont, CA (US)

( * ) Notice: Subject to any disclaimer, the term of this patent is extended or adjusted under 35 U.S.C. 154(b) by 2055 days.

(21) Appl. No.: 13/303,386

(22) Filed: Nov. 23, 2011

(65) Prior Publication Data

US 2013/0092086 A1    Apr. 18, 2013

Related U.S. Application Data

(60) Provisional application No. 61/547,962, filed on Oct. 17, 2011.

(51) Int. Cl.
*H01J 37/32*    (2006.01)

(52) U.S. Cl.
CPC .... *H01J 37/32091* (2013.01); *H01J 37/3255* (2013.01)

(58) Field of Classification Search
USPC .............. 118/156, 728–730, 723 E; 156/345.51–345.55, 345.43–345.47;
(Continued)

(56) References Cited

U.S. PATENT DOCUMENTS 5,290,381 A * 3/1994 Nozawa ............ H01J 37/32431
                                                        118/715
5,366,585 A    11/1994 Robertson et al.
(Continued)

FOREIGN PATENT DOCUMENTS

CN    101620989 A    1/2010
JP    11-214195 A    8/1999
(Continued)

OTHER PUBLICATIONS

Notification Concerning Transmittal of International Preliminary Report on Patentability for PCT/US2012/052789 filed Aug. 29, 2012; 10 pages.
(Continued)

*Primary Examiner* — Gordon Baldwin
*Assistant Examiner* — Mirza Israr Javed (57) ABSTRACT

A system for reducing parasitic plasma in a semiconductor process comprises a first surface and a plurality of dielectric layers that are arranged between an electrode and the first surface. The first surface and the electrode have substantially different electrical potentials. The plurality of dielectric layers defines a first gap between the electrode and one of the plurality of dielectric layers, a second gap between adjacent ones of the plurality of dielectric layers, and a third gap between a last one of the plurality of dielectric layers and the first surface. A number of the plurality of dielectric layers and sizes of the first gap, the second gap and the third gap are selected to prevent parasitic plasma between the first surface and the electrode during the semiconductor process.

21 Claims, 5 Drawing Sheets

(58) Field of Classification Search
USPC ........................................................ 361/234
See application file for complete search history.

(56) References Cited

U.S. PATENT DOCUMENTS

| | | | |
|---|---|---|---|
| 5,382,311 A * | 1/1995 | Ishikawa | C23C 16/4586 |
| | | | 118/723 E |
| 5,443,648 A * | 8/1995 | Ohkase | C23C 16/54 |
| | | | 118/715 |
| 5,539,179 A * | 7/1996 | Nozawa | H01L 21/6831 |
| | | | 156/345.51 |
| 5,567,243 A | 10/1996 | Foster et al. | |
| 5,628,829 A | 5/1997 | Foster et al. | |
| 5,637,146 A | 6/1997 | Chyi | |
| 5,680,013 A | 10/1997 | Dornfest et al. | |
| 5,772,770 A | 6/1998 | Suda et al. | |
| 5,959,409 A | 9/1999 | Dornfest et al. | |
| 5,996,528 A | 12/1999 | Berrien et al. | |
| 6,001,183 A * | 12/1999 | Gurary | C23C 16/4584 |
| | | | 118/720 |
| 6,051,100 A | 4/2000 | Walko, II | |
| 6,095,085 A | 8/2000 | Agarwal | |
| 6,120,640 A | 9/2000 | Shih et al. | |
| 6,120,661 A | 9/2000 | Hirano et al. | |
| 6,235,146 B1 * | 5/2001 | Kadotani | H01L 21/67023 |
| | | | 118/723 E |
| 6,415,736 B1 | 7/2002 | Hao et al. | |
| 6,453,992 B1 | 9/2002 | Kim | |
| 6,494,958 B1 | 12/2002 | Shamouilian et al. | |
| 6,506,254 B1 | 1/2003 | Bosch et al. | |
| 6,634,314 B2 | 10/2003 | Hwang et al. | |
| 6,783,627 B1 | 8/2004 | Mahawili | |
| 6,902,620 B1 | 6/2005 | Omstead et al. | |
| 7,147,760 B2 * | 12/2006 | Woodruff | C25D 17/12 |
| | | | 204/230.2 |
| 7,153,542 B2 | 12/2006 | Nguyen et al. | |
| 7,337,745 B1 | 3/2008 | Komino et al. | |
| 7,661,386 B2 | 2/2010 | Kasai et al. | |
| 7,712,434 B2 | 5/2010 | Dhindsa et al. | |
| 7,749,353 B2 | 7/2010 | Rusu et al. | |
| 7,802,539 B2 | 9/2010 | Bosch | |
| 8,043,842 B2 | 10/2011 | Blattner et al. | |
| 8,083,855 B2 | 12/2011 | Dhindsa et al. | |
| 8,137,467 B2 | 3/2012 | Meinhold et al. | |
| 8,216,486 B2 | 7/2012 | Dhindsa et al. | |
| 8,443,756 B2 | 5/2013 | Fischer et al. | |
| 8,733,279 B2 | 5/2014 | White et al. | |
| 2001/0047760 A1 | 12/2001 | Moslehi | |
| 2002/0017243 A1 | 2/2002 | Pyo | |
| 2002/0048311 A1 * | 4/2002 | Norrbakhsh | C30B 25/16 |
| | | | 374/141 |
| 2002/0158060 A1 * | 10/2002 | Uchiyama | H01L 21/67103 |
| | | | 219/444.1 |
| 2003/0196760 A1 | 10/2003 | Tyler et al. | |
| 2003/0205202 A1 | 11/2003 | Funaki et al. | |
| 2004/0000378 A1 | 1/2004 | Lee et al. | |
| 2004/0065255 A1 | 4/2004 | Yang et al. | |
| 2004/0074609 A1 | 4/2004 | Fischer et al. | |
| 2004/0149212 A1 | 8/2004 | Cho et al. | |
| 2004/0187779 A1 | 9/2004 | Park et al. | |
| 2005/0173569 A1 | 8/2005 | Noorbakhsh et al. | |
| 2005/0241765 A1 | 11/2005 | Dhindsa et al. | |
| 2006/0057303 A1 | 3/2006 | Agarwal et al. | |
| 2007/0031236 A1 | 2/2007 | Chen | |
| 2007/0137573 A1 | 6/2007 | Kholodenko et al. | |
| 2007/0256785 A1 | 11/2007 | Pamarthy et al. | |
| 2007/0266945 A1 | 11/2007 | Shuto et al. | |
| 2008/0017111 A1 * | 1/2008 | Ishisaka | H01J 37/32082 |
| | | | 118/723 E |
| 2008/0066682 A1 * | 3/2008 | Yamashita | C23C 16/4586 |
| | | | 118/723 VE |
| 2008/0075858 A1 | 3/2008 | Koh | |
| 2008/0196666 A1 | 8/2008 | Toshima | |
| 2008/0241517 A1 | 10/2008 | Kenworthy et al. | |
| 2009/0000743 A1 | 1/2009 | Iizuka | |
| 2009/0078694 A1 * | 3/2009 | Hayashi | H01L 21/68785 |
| | | | 219/444.1 |
| 2009/0095219 A1 | 4/2009 | Meinhold et al. | |
| 2009/0159587 A1 * | 6/2009 | Shimanuki | H05B 3/143 |
| | | | 219/443.1 |
| 2009/0190908 A1 * | 7/2009 | Shibagaki | H01L 21/67115 |
| | | | 392/416 |
| 2010/0000684 A1 * | 1/2010 | Choi | H01J 37/32541 |
| | | | 156/345.43 |
| 2010/0059182 A1 * | 3/2010 | Lee | C23C 16/46 |
| | | | 156/345.52 |
| 2010/0083902 A1 * | 4/2010 | Kim | C23C 16/4586 |
| | | | 118/723 R |
| 2010/0103584 A1 * | 4/2010 | Nam | H01L 21/67103 |
| | | | 361/234 |
| 2011/0198417 A1 | 8/2011 | Delmar et al. | |
| 2012/0097330 A1 | 4/2012 | Iyengar et al. | |
| 2012/0220109 A1 | 8/2012 | Komori et al. | |
| 2012/0222815 A1 | 9/2012 | Sabri et al. | |
| 2012/0225193 A1 | 9/2012 | Yudovsky | |
| 2012/0225195 A1 | 9/2012 | Yudovsky | |
| 2013/0233491 A1 | 9/2013 | Choi | |
| 2013/0269609 A1 | 10/2013 | Leeser | |
| 2013/0344245 A1 | 12/2013 | Xia et al. | |
| 2014/0116338 A1 | 5/2014 | He et al. | |
| 2014/0165911 A1 | 6/2014 | Kao et al. | |
| 2014/0238608 A1 | 8/2014 | Sabri et al. | |

FOREIGN PATENT DOCUMENTS

| | | |
|---|---|---|
| KR | 10-0388530 B1 | 6/2003 |
| KR | 100565131 | 3/2006 |
| KR | 20080001336 A | 1/2008 |
| KR | 10-0845896 B1 | 7/2008 |
| KR | 10-2010-0004857 A | 1/2010 |
| WO | WO-9943018 A1 | 8/1999 |

OTHER PUBLICATIONS

International Search Report and Written Opinion for PCT/US2012/052789 filed Aug. 28, 2012; 13 pages.

Translation of Notification of Examination Opinions dated Feb. 17, 2016 corresponding to Taiwan Patent Application No. 101138269, 3 pages.

First Office Action dated Nov. 17, 2015 corresponding to Chinese Patent Application No. 201280062473.3, 8 pages.

* cited by examiner

FIG. 5

MECHANICAL SUPPRESSION OF PARASITIC PLASMA IN SUBSTRATE PROCESSING CHAMBER

CROSS-REFERENCE TO RELATED APPLICATIONS

This application claims the benefit of U.S. Provisional Application No. 61/547,962, filed on Oct. 17, 2011. The disclosure of the above application is incorporated herein by reference in its entirety.

FIELD

The present disclosure relates to processing chambers, and more particularly to systems and methods for reducing parasitic plasma in plasma-enhanced semiconductor processing chambers.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Some semiconductor processing systems may employ plasma when depositing thin films on a substrate in a processing chamber. Generally, the substrate is arranged on a pedestal in the processing chamber. To create the thin film using chemical vapor deposition, one or more precursors are supplied by a showerhead to the processing chamber.

During processing, radio frequency (RF) power may be supplied to the showerhead or to an electrode to create plasma. For example, RF power may be supplied to the electrode embedded in a pedestal platen, which may be made of a non-conducting material such as ceramic. Another conducting portion of the pedestal may be connected to RF ground or another substantially different electrical potential.

When the electrode is excited by the RF power, RF fields are generated between the substrate and the showerhead to create plasma between the wafer and the showerhead. When the pedestal platen is made of ceramic, the RF fields will also appear under and beside the pedestal platen and give rise to parasitic plasma. Parasitic plasma may be reduced or eliminated in certain regions if the electric fields penetrating these regions can be reduced. One way to reduce or eliminate the electric fields is to use a grounded RF shield. However, if the RF shield is not designed properly, it can give rise to a low RF impedance path to ground.

One way to prevent excessive RF coupling to ground is to use a solid dielectric layer between ground and the electrode. However, the thickness of the solid dielectric layer that is required to achieve low coupling capacitance to ground is generally not practical.

SUMMARY

A plasma reducing system for reducing parasitic plasma in a semiconductor process comprises a first surface and a plurality of dielectric layers that are arranged between an electrode and the first surface. The first surface and the electrode have substantially different electrical potentials. The plurality of dielectric layers defines a first gap between the electrode and one of the plurality of dielectric layers, a second gap between adjacent ones of the plurality of dielectric layers, and a third gap between a last one of the plurality of dielectric layers and the first surface. A number of the plurality of dielectric layers and sizes of the first gap, the second gap and the third gap are selected to prevent parasitic plasma between the first surface and the electrode during the semiconductor process.

In other features, the first surface comprises a grounded conducting structure. Barriers are arranged between radially outer ends of the plurality of dielectric layers to prevent incursion of deposition precursor species between the plurality of dielectric layers. Diameters of each of the plurality of dielectric layers decrease as a distance increases between the electrode and a respective one of the plurality of dielectric layers. Each of the plurality of dielectric layers comprises a radially inner portion having a first thickness in an axial direction and a protruding portion that extends radially outwardly and has a second thickness in the axial direction. A difference between the first thickness and the second thickness is equal to the second gap. The semiconductor process comprises plasma-enhanced chemical vapor deposition (PECVD).

In other features, a pedestal comprises the plasma reducing system, a pedestal including a pedestal platen that supports a substrate and that is made of a non-conducting material, and the electrode. The electrode is embedded in the pedestal platen. During the semiconductor process, the grounded conducting structure is connected to RF ground and the electrode is connected to an RF bias.

In other features, a collar is connected to the first surface and an adapter is connected to the collar. The first surface, the collar and the adapter are made of aluminum. The pedestal platen comprises ceramic, the first surface comprises a conducting disk, the electrode comprises wire mesh and each of the plurality of dielectric layers comprises a disk.

In other features, a showerhead system comprises the plasma reducing system. The electrode includes a showerhead including a first stem portion and a head portion. The plurality of dielectric layers comprise M dielectric layers arranged adjacent to the head portion and P dielectric portions arranged around the first stem portion, wherein M and P are integers greater than one.

In other features, the grounded conducting structure comprises a second stem portion arranged around the first stem portion and the P dielectric portions and a disk portion that projects radially outwardly from the second stem portion. During the semiconductor process, the showerhead is connected to an RF bias and the grounded conducting structure is connected to RF ground.

A pedestal system for a semiconductor process comprises a pedestal platen that supports a substrate, that is made of a non-conducting material and that includes an electrode embedded therein. A first surface has a substantially different electrical potential than the electrode. N dielectric layers are arranged between the pedestal platen and the first surface, where N is an integer that is greater than one. The N dielectric layers define a first gap between the pedestal platen and the N dielectric layers, a second gap between adjacent ones of the N dielectric layers, and a third gap between the N dielectric layers and the first surface. N and sizes of the first gap, the second gap and the third gap are selected to prevent parasitic plasma between the first surface and the electrode during the semiconductor process.

A showerhead system for a semiconductor process comprises a showerhead. A first surface has a substantially different electrical potential than the showerhead. A dielectric structure includes a plurality of spaced dielectric layers and is arranged between the first surface and the showerhead. A number of the plurality of spaced dielectric layers and spacing between the plurality of spaced dielectric layers are selected to prevent parasitic plasma between the first surface and the showerhead during the semiconductor process.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
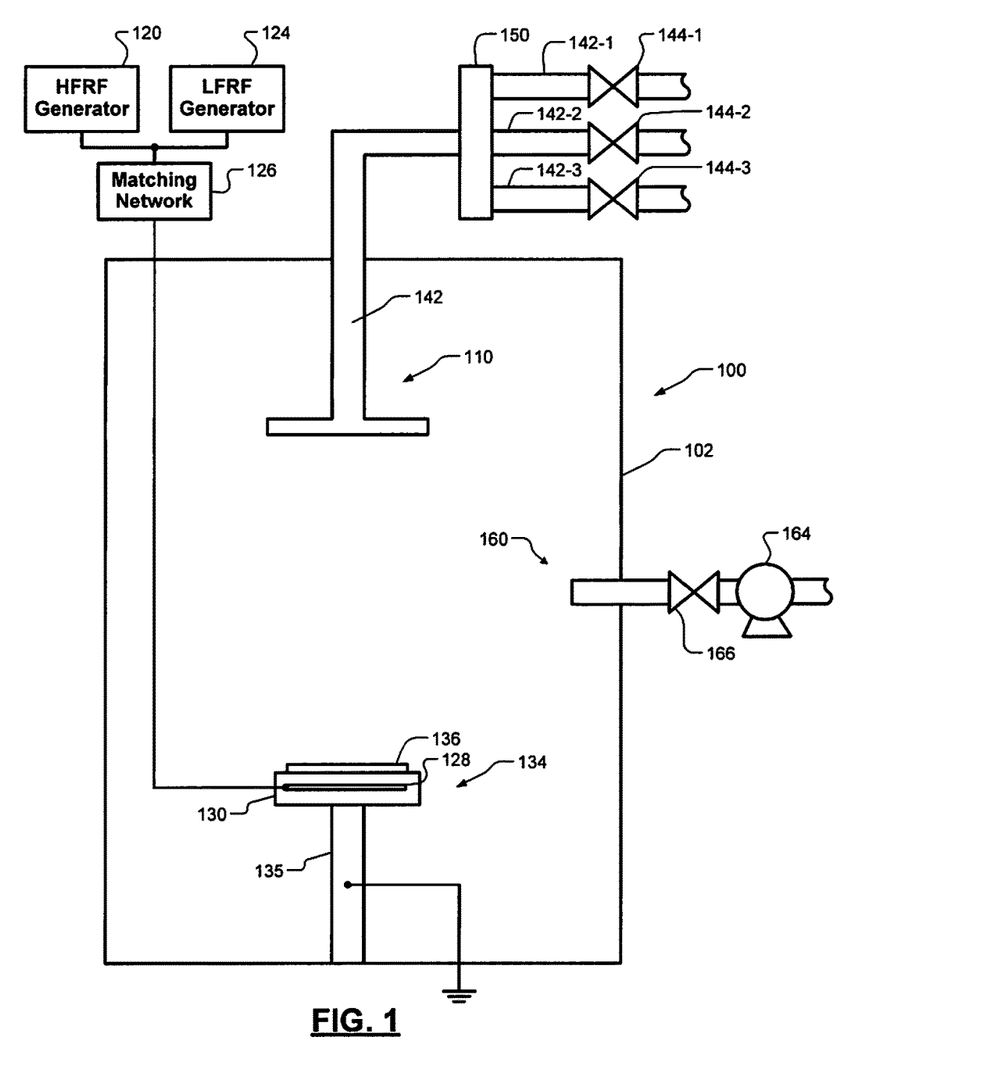
FIG. 1 is a functional block diagram of a semiconductor process chamber.
Figure 2A:
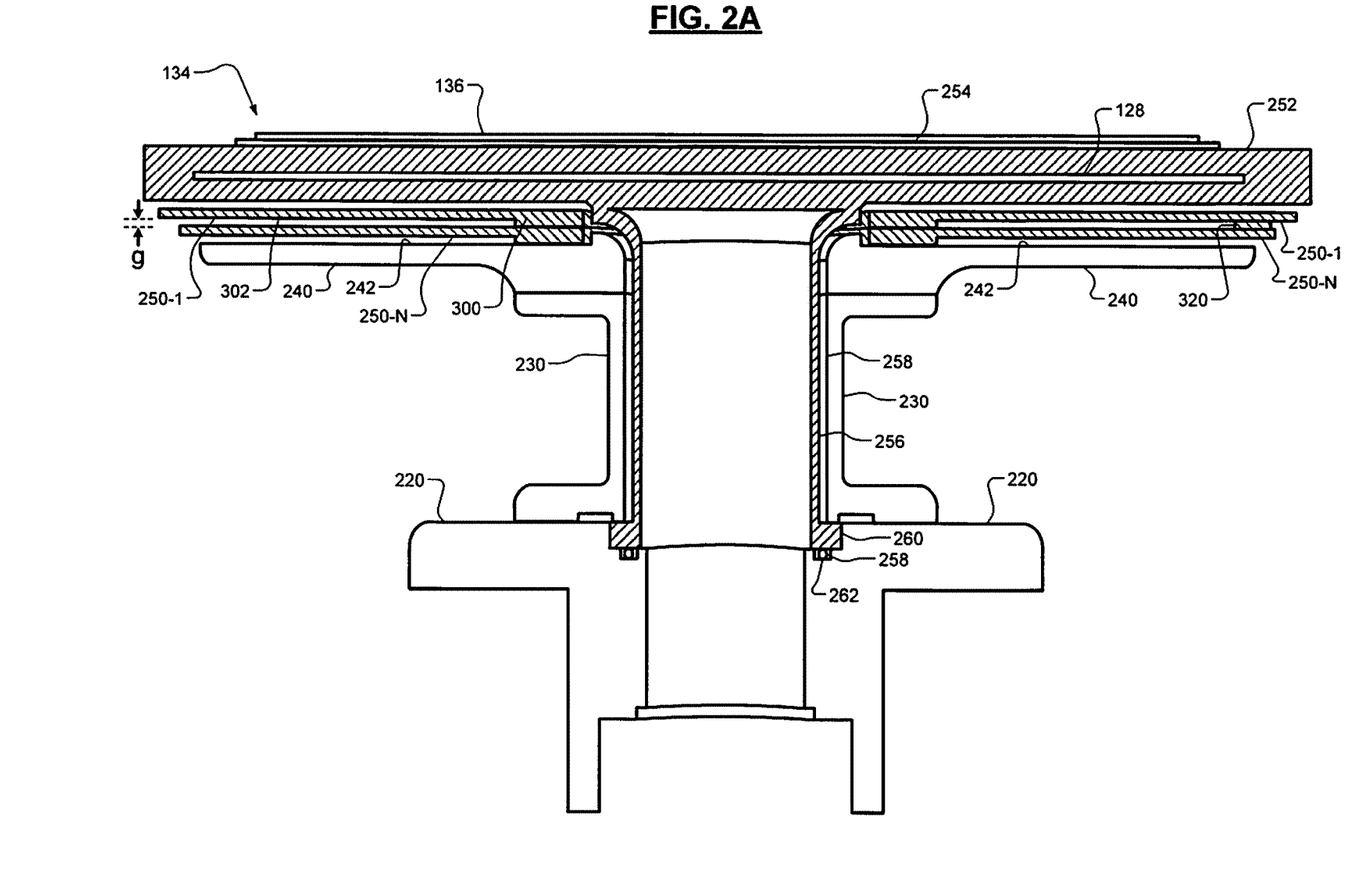
FIG. 2A is a side cross-sectional view of a system for reducing parasitic plasma near a pedestal according to the present disclosure.

Referring now to FIG. 1, a semiconductor processing device 100 includes a process chamber 102. While a plasma-enhanced chemical vapor deposition process (PECVD) is shown, other semiconductor processes may be used. The semiconductor processing device 100 further includes a showerhead system 110 to deliver process gases to the process chamber 102. A high-frequency (HF) RF generator 120 and a low-frequency (LF) RF generator 124 are connected by a matching network 126 to an electrode 128 arranged inside of a non-conducting portion 130 of a pedestal system 134 (shown in more detail in FIG. 2).

Another portion 135 of the pedestal system 134 has a substantially different electrical potential than the electrode 128. For example the portion 135 may be connected to a ground reference potential. Alternately, the HF RF generator 120, the LF RF generator 124 and the matching network 126 can be connected to the showerhead system 110.

The RF signal supplied by the matching network 126 has a power and a frequency sufficient to generate plasma from the process gas. In a typical process, the HF RF generator 120 may operate in a frequency range of 2-60 MHz, although other frequencies may be used. The LF RF generator 124 may operate in a frequency range of 100 kHz-2 MHz, although other frequencies may be used. Suitable power levels may include LF power at about 200-600 W and HF power at about 100-1500 W, although other power levels may be used. The process chamber may be operated at approximately 500 mT-12 Torr.

The pedestal system 134 typically includes a chuck, a fork, or lift pins (all not shown) to hold and transfer a substrate 136 during and between deposition and/or plasma treatment reactions. The chuck may be an electrostatic chuck, a mechanical chuck or various other types of chuck.

The process gases are introduced via inlet 142. Multiple process gas lines 142-1, 142-2, 142-3, are connected to a manifold 150. The process gases may be premixed or not. Appropriate valving and mass flow control mechanisms (generally identified at 144-1, 144-2, 144-3, . . . ) are employed to ensure that the correct gases are delivered during the deposition and plasma treatment phases of the process. In some examples, the chemical precursor(s) are initially delivered in the liquid form. For example only, the liquid may be vaporized and mixed with other process gases in a manifold that is heated above a vaporization temperature. Process gases exit the process chamber 102 via an outlet 160. A vacuum pump 164 typically draws process gases out of the process chamber 102 and maintains a suitably low pressure within the reactor by a flow restriction device, such as a valve 166.

The system for reducing parasitic plasma according to the present disclosure can be retro-fit to existing systems and/or implemented when the semiconductor processing system is initially installed. The system suppresses unwanted (parasitic) plasma near RF powered surfaces (e.g. an electrode in a pedestal or showerhead) while providing a high impedance path to ground from those surfaces. The high impedance path is created using a plurality of spaced dielectric layers, which have a lower dielectric constant than can be achieved using a solid dielectric layer. Alternating gaps and dielectric layers may be terminated by a surface having a substantially different electrical potential such as a grounded conducting structure.

Referring now to FIG. 2A, the pedestal system 134 of FIG. 1 is shown in further detail. The pedestal system 134 includes an adapter 220. A collar 230 is connected to the adapter 220. A conducting structure 240 including a first (e.g., upper) surface 242) is connected to the collar 230 and is arranged generally parallel to a pedestal platen 252. The conducting structure 240 may be disk-shaped or another suitable shape. N dielectric layers 250-1, . . . , and 250-N (collectively N dielectric layers 250) are arranged between the conducting structure 240 and the pedestal platen 252, where N is an integer greater than one. The N dielectric layers 250 are arranged parallel to the pedestal platen 252. The N dielectric layers 250 may be disk-shaped or another suitable shape. In some examples, a diameter of each of the N dielectric layers may decrease as a distance from the electrode increases.

In some examples, a gap "g" is provided between the conducting structure 240 and a first one of the N dielectric layers 250, between adjacent ones of the N dielectric layers 250 and between a last one of the N dielectric layers 250 and the pedestal platen 252. The pedestal platen 252 may be made of a non-conducting material such as ceramic or other suitable material. In some examples, N=2, although additional or fewer dielectric disks may be used.

An additional surface 254 or "mesa" may be provided on a top surface of the pedestal platen 252. The substrate 136 may be arranged on an upper surface of the pedestal platen 252 or on the additional surface 254 or mesa. The pedestal platen 252 may include an inner cylindrical portion 256 that extends downwardly through an inner cylindrical portion 258 of the collar 230. The pedestal platen 252 may include a flanged portion 260 that extends radially outwardly from a bottom end of the inner cylindrical portion 258. The flanged portion 260 may mate with a recess 262 formed in the adapter 220. A seal 266 such as an "O"-ring may be arranged between the recess 262 and the flanged portion 260.

The electrode 128 may be embedded in the pedestal platen 252. In some examples, the electrode 128 may include a wire mesh or spaced conductors. In other examples, the conducting structure 240 may have a diameter that is greater than the adapter 220, greater than the substrate 136 and/or less than the diameter of the pedestal platen 252. In some examples, the adapter 220, the collar 230 and the conducting structure 240 may be made of metal such as aluminum or another suitable conducting material.

In some examples, the metal adapter 220, the collar 230 and the conducting structure 240 are connected to RF ground or another electrical potential that is substantially different than the electrode 128. The combination of the N dielectric layers 250, the adapter 220, the collar 230 and the conducting structure 240 provide RF shielding, which attenuates the RF fields below the pedestal platen 252. This, in turn, significantly attenuates plasma density formed below the pedestal platen 252. This design has been shown to reduce parasitic plasma density by a factor of about 5.

The presence of conducting grounded surfaces (such as the adapter 220, the collar 230 and/or the conducting structure 240) near RF "hot" surfaces (such as the conducting structure 240) presents a problem if the capacitive coupling of the RF "hot" surfaces to ground is too high. In some examples, coupling capacitance to ground may be limited to values less than 100 picoFarads (pF). Insertion of a dielectric sufficiently thick to provide low capacitive coupling (i.e. values less than 100 pF) typically results in very thick layers (many cm in size) that are either not practical or expensive to implement. In some examples, the present disclosure resolves this problem using the N dielectric layers or disks with a gap between them, where N is an integer greater than one.

An equivalent circuit corresponding to the spaced N dielectric layers includes multiple capacitors that are connected in series. The net capacitance of the series connection of the equivalent capacitors is lower than the lowest capacitor value. For the dielectric stack shown in FIG. 2A, the lowest capacitance in the series connection of the equivalent capacitors will generally correspond to the capacitance associated with the gap between the N dielectric layers 250.

Since the RF fields in the dielectric stack are still very high, plasma formation (plasma light-up) may occur between the N dielectric layers 250. In some examples, the gap g is selected such that it is sufficiently small to prevent formation of "bulk" plasma. For example only, the gap g that is less than or equal to 3 mm tends to prevent plasma formation when N=2 for pressures and power levels that are typically used. However, the size of the gap g may be set to other values when N=2, when N>2, or when different pressures or RF power levels are used. The size of the gap and the number of dielectric layers may be selected to prevent plasma formation between the dielectric layers during the semiconductor process for the selected species and selected process conditions such as temperature, pressure and RF power and frequency.

In some examples, the N dielectric layers 250 include a radially inner portion 300 having a first thickness in an axial direction and a protruding portion 302 that extends radially outwardly and has a second thickness in the axial direction. A difference between the first thickness and the second thickness is equal to the gap g.

In some examples, one or more barriers 320 may be arranged between radially outer ends of the N dielectric layers 250 to prevent incursion of deposition precursor species between the N dielectric layers 250. While only one barrier is shown, additional barriers may be arranged in other locations to prevent incursion of deposition precursor into the gaps. For example only, the barriers 320 may be made from any suitable dielectric material that does not shed particles. The barriers 320 tend to reduce the risk for creating a difficult to clean site that can lead to accumulation of film between the N dielectric layers 250 that could radiate particles into the process chamber 102.

Figure 2B:
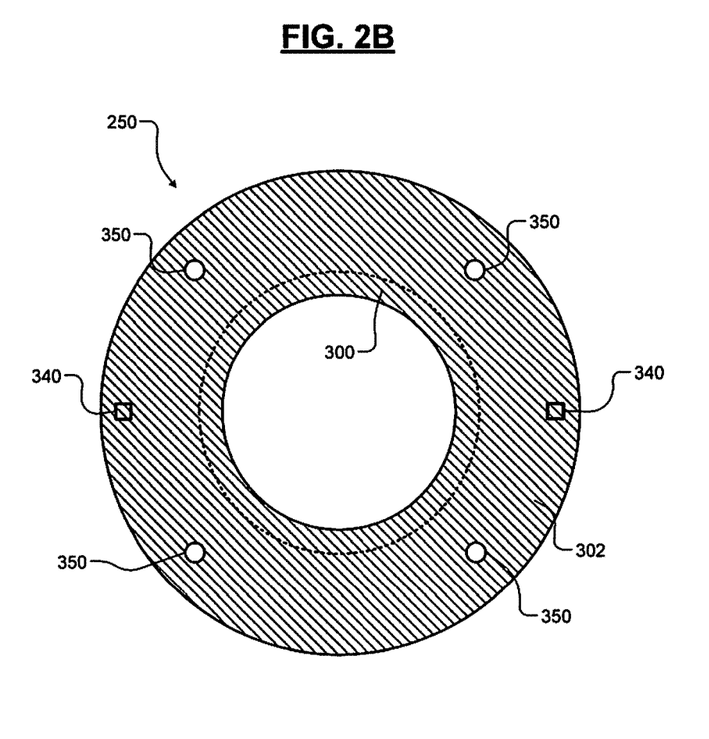
FIG. 2B is a plan view of a dielectric layer according to the present disclosure.

Referring now to FIG. 2B, in some examples, the N dielectric layers 250 may include an alignment structure generically identified at 340 such as one or more notches, holes, protrusions or other structures that are used to ensure that the angular orientation or clocking of the N dielectric layers 250 is not arbitrary. Additionally, one or more lift pin holes 350 may be provided in the N dielectric layers 250 and/or conducting structure 240 to provide sufficient clearance to allow lift pins to lift the substrate 136.

Figure 3:
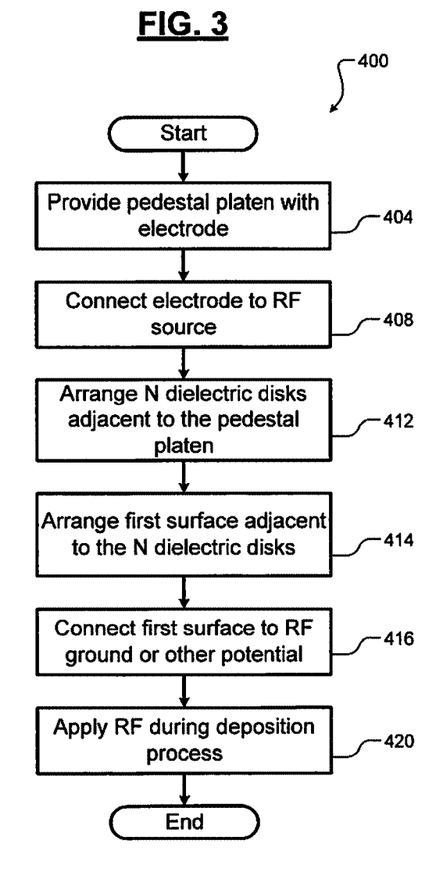
FIG. 3 illustrates an example of a method for reducing parasitic plasma in a PECVD process according to the present disclosure.

Referring now to FIG. 3, a method 400 for reducing formation of parasitic plasma is shown. At 404, the electrode 128 is embedded in the pedestal platen 252. At 408, the electrode 128 is connected to an RF bias. At 412, N dielectric layers 250 are arranged adjacent to the pedestal platen 252. At 414, the conducting structure 240 or another surface having a substantially different electrical potential is arranged adjacent to the N dielectric layers 250. At 416, the conducting structure 240 is connected to RF ground of another electrical potential. At 420, the RF bias is applied to the electrode 128 during a process, such as during deposition of a thin film in a PECVD process.

Figure 4:
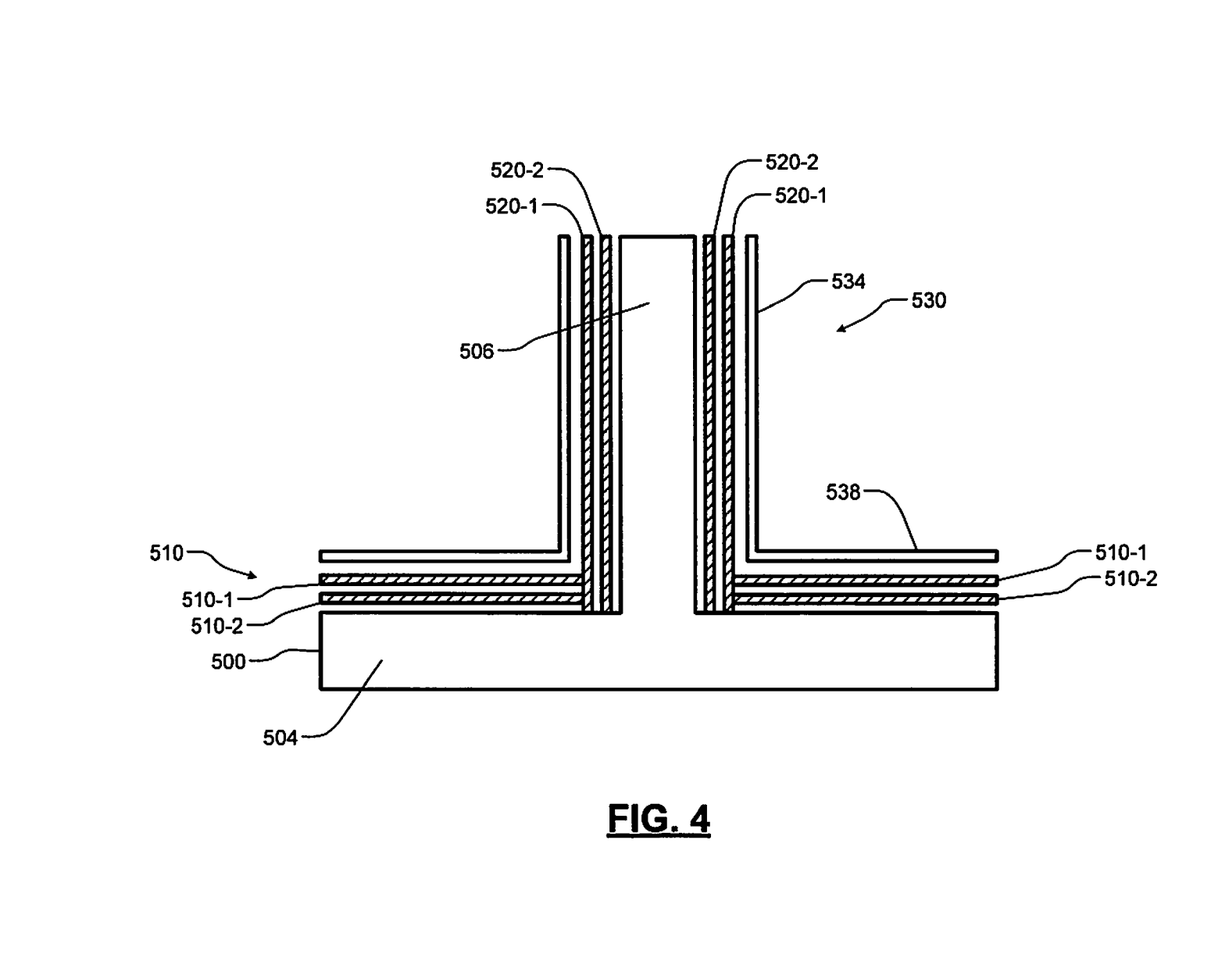
FIG. 4 illustrates a system for reducing parasitic plasma near a showerhead according to the present disclosure.

Referring now to FIG. 4, a system according to the present disclosure is used to reduce parasitic plasma that may occur near a showerhead 500. The showerhead 500 includes a head portion 504 and a stem portion 506. M dielectric layers 510-1, . . . , and 510-M (collectively referred to as the M dielectric layers 510) are arranged horizontally adjacent to the head portion 504. The M dielectric layers 510 can be disk-shaped.

P dielectric portions 520-1, . . . , and 520-P (collectively referred to as the P dielectric portions 520) are arranged vertically adjacent to the stem portion 506. A conducting portion 530 is arranged adjacent to the M dielectric layers 510 and the P dielectric layers 520. The conducting portion 530 may include a cylindrical stem portion 534 and a disk portion 538 that projects radially outwardly from one end of the cylindrical stem portion 534.

In some examples, the P dielectric layers 520 may have a cylindrical cross section and the M dielectric layers 510 have a disk shape similar to that shown in FIG. 2B. The showerhead 500 is connected to an RF source, such as the RF generators 120 and 124 and the matching network 126 shown in FIG. 1 or any other suitable RF source. The conducting portion 530 may be connected to ground or another substantially different electrical potential. The RF shielding system in FIG. 4 tends to reduce formation of parasitic plasma near an upper surface of the showerhead 500. Gaps are defined between the M dielectric layers 510 and the P dielectric layers 520 as described above. The size of the gaps and the number of dielectric layers may be selected to prevent plasma formation between the dielectric layers during the semiconductor process for the selected species and selected process conditions such as temperature, pressure and RF power and frequency.

Figure 5:
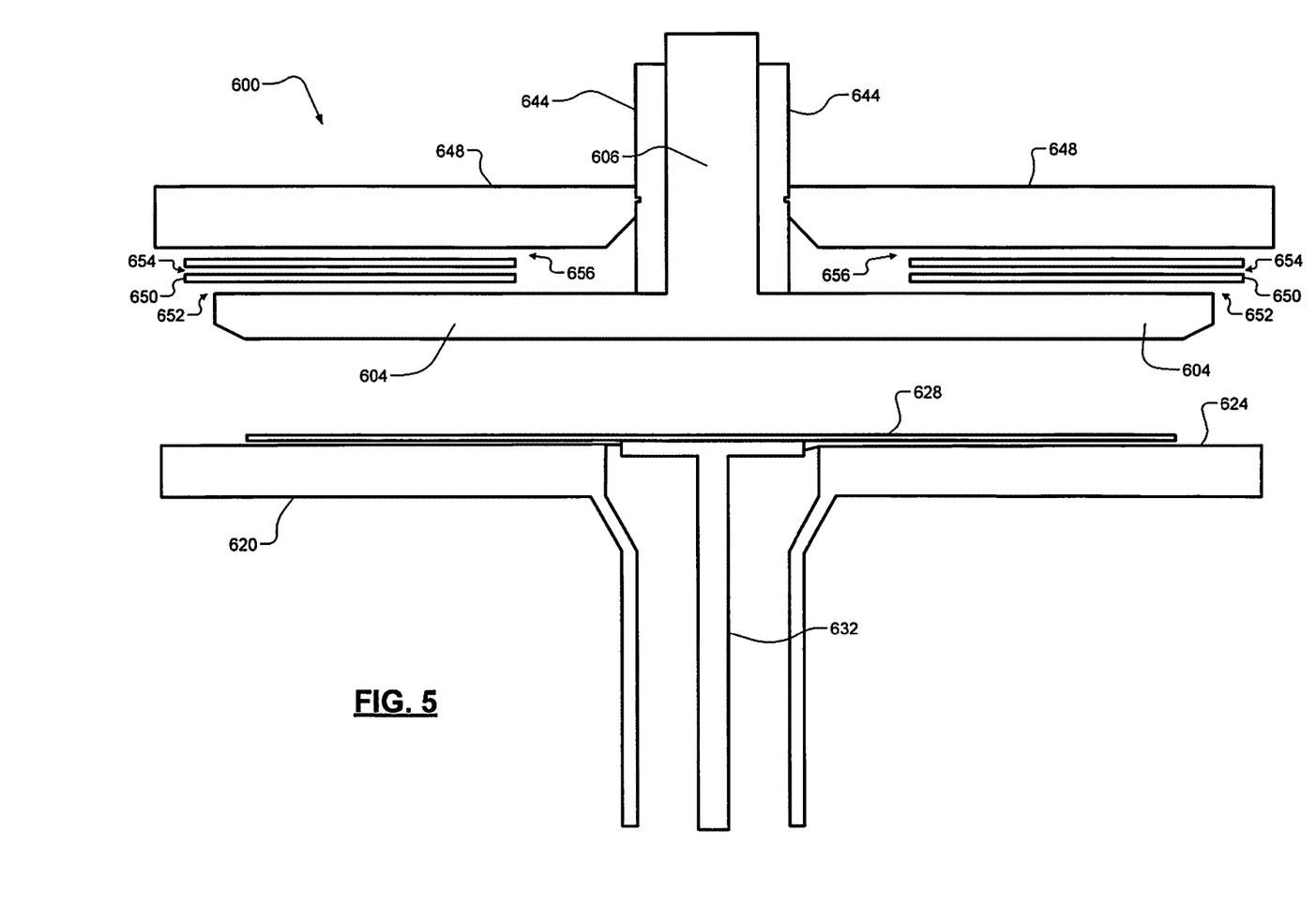
FIG. 5 illustrates another system for reducing parasitic plasma near a showerhead according to the present disclosure.

Referring now to FIG. 5, another system according to the present disclosure is used to reduce parasitic plasma that may occur near a showerhead 600. The showerhead 600 includes a head portion 604 and a stem portion 606. A pedestal 620 is arranged below the showerhead 600. A chuck, a fork, or lift pins generally identified at 632 hold and transfer a substrate 628 during and between deposition and/or plasma treatment reactions.

A first supporting portion 644 is connected to a top portion 646 of the processing chamber. The first supporting portion 644 is arranged adjacent to the stem portion 606 of the showerhead 600. The top portion 646 of the processing chamber or any other surface at a different electrical potential is arranged adjacent to the head portion 604 of the showerhead 600. A plurality of dielectric layers or disks 650 are arranged between the head portion 604 and the top portion 646. A first gap 652 is defined between the head portion 604 and a first one of the plurality dielectric layers 650. A second gap 654 is defined between adjacent ones of the plurality dielectric layers 650. A third gap 656 is defined between a last one of the plurality dielectric layers 650 and the supporting portion 648.

In some examples, the head portion 604 and the stem portion 606 of the showerhead 600 may be made of a conducting material and may be connected to an RF bias source. The first supporting portion 644 may be made of an insulating material. The pedestal 620 may be made of a conducting material and may be connected to a ground reference potiential. As can be appreciated, the top portion 646 of the processing chamber has a substantially different electrical potential than the showerhead 600. As a result, parasitic plasma may be formed in a gap between the showerhead and the top portion of the processing chamber.

According to the present disclosure, the plurality of dielectric layers are separated by gaps and are arranged between the showerhead and the top portion of the processing chamber to eliminate the parasitic plasma that would otherwise be created. As with the preceding examples, the size of the gaps 652, 654 and 656 and the number of dielectric layers 650 are selected to prevent plasma formation in the area between the showerhead 600 and the top portion 646 of the processing chamber during the semiconductor process for the selected species and selected process conditions such as temperature, pressure and RF power and frequency.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A system for reducing parasitic plasma in a semiconductor process, comprising:
    a first surface of a conducting structure; and
    a plurality of dielectric layers that are vertically stacked between an electrode and the first surface,
    wherein the first surface and the electrode have substantially different electrical potentials,
    wherein the plurality of dielectric layers defines:
        a first gap between the electrode and one of the plurality of dielectric layers,
        a second gap between adjacent ones of the plurality of dielectric layers, and
        a third gap between a last one of the plurality of dielectric layers and the first surface, and
    wherein a number of the plurality of dielectric layers and sizes of the first gap, the second gap and the third gap are selected to prevent parasitic plasma between the first surface and the electrode during the semiconductor process.

2. The system of claim 1, wherein the conducting structure corresponds to a grounded conducting structure.

3. The system of claim 1, further comprising barriers arranged between radially outer ends of the plurality of dielectric layers to prevent incursion of deposition precursor species between the plurality of dielectric layers.

4. The system of claim 1, wherein diameters of each of the plurality of dielectric layers decrease as a distance increases between the electrode and a respective one of the plurality of dielectric layers.

5. The system of claim 1, wherein each of the plurality of dielectric layers comprises a radially inner portion having a first thickness in an axial direction and a protruding portion that extends radially outwardly and has a second thickness in the axial direction.

6. The system of claim 5, wherein a difference between the first thickness and the second thickness is equal to the second gap.

7. The system of claim 1, wherein the semiconductor process comprises plasma-enhanced chemical vapor deposition (PECVD).

8. A pedestal system comprising:
    the system of claim 2; and
    a pedestal platen that supports a substrate and that is made of a non-conducting material,
    the electrode, wherein the electrode is embedded in the pedestal platen.

9. The pedestal system of claim 8, wherein during the semiconductor process, the grounded conducting structure is connected to RF ground and the electrode is connected to an RF bias.

10. The pedestal system of claim 8, further comprising:
    a collar that is connected to the first surface; and
    an adapter that is connected to the collar.

11. The pedestal system of claim 10, wherein the first surface, the collar and the adapter are made of aluminum.

12. The pedestal system of claim 8, wherein the pedestal platen comprises ceramic, the first surface comprises a conducting disk, the electrode comprises wire mesh and each of the plurality of dielectric layers comprises a disk.

13. A pedestal system for a semiconductor process, comprising:
    a pedestal platen that supports a substrate, that is made of a non-conducting material and that includes an electrode embedded therein;
    a first surface of a conducting structure having a substantially different electrical potential than the electrode;
    N dielectric layers that are vertically stacked between the pedestal platen and the first surface, where N is an integer that is greater than one; and
    wherein the N dielectric layers define:
        a first gap between the pedestal platen and the N dielectric layers,
        a second gap between adjacent ones of the N dielectric layers, and a third gap between the N dielectric layers and the first surface, and wherein N and sizes of the first gap, the second gap and the third gap are selected to prevent parasitic plasma between the first surface and the electrode during the semiconductor process.

14. The pedestal system of claim 13, wherein the electrode is connected to an RF bias and the first surface is connected to RF ground during the semiconductor process.

15. The pedestal system of claim 13, further comprising:
a collar that is connected to the first surface; and
an adapter that is connected to the collar.

16. The pedestal system of claim 15, wherein the first surface, the collar and the adapter are made of aluminum.

17. The pedestal system of claim 13, wherein the pedestal platen comprises ceramic and wherein the electrode comprises wire mesh.

18. The pedestal system of claim 13, wherein N and a width of the second gap are selected to prevent plasma formation between the N dielectric layers.

19. The pedestal system of claim 13, wherein the N dielectric layers comprise a radially inner portion having a first thickness in an axial direction and a protruding portion that extends radially outwardly and has a second thickness in the axial direction, and wherein a difference between the first thickness and the second thickness is equal to the second gap.

20. The pedestal system of claim 13, wherein the pedestal platen has a diameter that is greater than a diameter of the N dielectric layers, and wherein the N dielectric layers have a diameter that is greater than the first surface.

21. The pedestal system of claim 13, further comprising barriers arranged between radially outer ends of the N dielectric layers.

* * * * *